(12) United States Patent
Hartl et al.

(10) Patent No.: US 9,048,626 B2
(45) Date of Patent: Jun. 2, 2015

(54) NOISE DETECTION, DIAGNOSTICS, AND CONTROL OF MODELOCKED LASERS

(71) Applicant: IMRA AMERICA, INC., Ann Arbor, MI (US)

(72) Inventors: Ingmar Hartl, Hamburg (DE); Christian Mohr, Whitmore Lake, MI (US)

(73) Assignee: IMRA AMERICA, INC., Ann Arbor, MI (US)

( * ) Notice: Subject to any disclaimer, the term of this patent is extended or adjusted under 35 U.S.C. 154(b) by 0 days.

(21) Appl. No.: 14/484,699

(22) Filed: Sep. 12, 2014

(65) Prior Publication Data

US 2015/0030045 A1    Jan. 29, 2015

Related U.S. Application Data

(63) Continuation of application No. PCT/US2013/065448, filed on Oct. 17, 2013.

(60) Provisional application No. 61/716,148, filed on Oct. 19, 2012.

(51) Int. Cl.
*H01S 3/00* (2006.01)
*H01S 3/11* (2006.01)
(Continued)

(52) U.S. Cl.
CPC ............. *H01S 3/1106* (2013.01); *H01S 5/0687* (2013.01); *H01S 5/06835* (2013.01); *H01S 5/06817* (2013.01); *H01S 5/065* (2013.01); *H01S 5/0657* (2013.01); *H01S 3/1121* (2013.01)

(58) Field of Classification Search
CPC .............. H01S 5/0687; H01S 5/06835; H01S 5/06817; H01S 5/065; H01S 5/0657; H01S 3/1106; H01S 3/1121

USPC ...................... 372/38.08, 38.09, 18
See application file for complete search history.

(56) References Cited

U.S. PATENT DOCUMENTS

| 5,696,782 A | 12/1997 | Harter |
| 6,181,463 B1 | 1/2001 | Galvanauskas |

(Continued)

FOREIGN PATENT DOCUMENTS

WO    2014/120292 A1    8/2014

OTHER PUBLICATIONS

Takara et al, in "Stabilization of a modelocked Er-doped fibre laser by suppressing the relaxation oscillation frequency component", Electronic Letters, Feb. 16, 1995, vol. 31 No. 4, 292-293.

(Continued)

*Primary Examiner* — Kinam Park
(74) *Attorney, Agent, or Firm* — Sughrue Mion, PLLC; Richard C. Turner

(57) ABSTRACT

The present invention features a laser based system configured with a noise detection unit. The system includes a mode-locked oscillator. A noise detection unit includes at least one optical detector that monitors optical pulses generated by the mode-locked oscillator and produces an electrical signal in response to the optical pulses. The noise detection unit includes a first filter to transmit signal power over a signal bandwidth which includes the mode-locked laser repetition frequency, frep. The noise detection unit may include one or more filters to transmit power over a noise bandwidth that substantially excludes repetition frequency, frep. Non-linear signal processing equipment is utilized to generate one or more signals representative of the power in the signal bandwidth relative to the power in the noise bandwidth. The system includes a controller operable to generate a signal for controlling the laser based system based on the relative power.

15 Claims, 8 Drawing Sheets

(51) Int. Cl.
  *H01S 5/0687* (2006.01)
  *H01S 5/0683* (2006.01)
  *H01S 5/068* (2006.01)
  *H01S 5/065* (2006.01)

(56) References Cited

U.S. PATENT DOCUMENTS

| | | |
|---|---|---|
| 6,208,458 B1 | 3/2001 | Galvanauskas |
| 6,335,941 B1 | 1/2002 | Grubb |
| 6,347,007 B1 | 2/2002 | Grubb |
| 6,433,306 B1 | 8/2002 | Grubb |
| 6,693,927 B1 | 2/2004 | Horvath |
| 6,839,363 B2 | 1/2005 | Lin |
| 7,505,196 B2 | 3/2009 | Nati |
| 7,649,915 B2 | 1/2010 | Fermann |
| 7,668,213 B2 | 2/2010 | Hoffman |
| 7,809,222 B2 | 10/2010 | Hartl |
| 8,031,396 B2 | 10/2011 | Fermann |
| 2002/0176452 A1* | 11/2002 | Lin et al. .......... 372/18 |
| 2003/0189711 A1* | 10/2003 | Orr et al. .......... 356/484 |
| 2003/0219069 A1 | 11/2003 | Chen et al. |
| 2006/0204170 A1* | 9/2006 | Igarashi et al. .......... 385/24 |
| 2006/0280505 A1 | 12/2006 | Varshneya et al. |
| 2009/0284828 A1 | 11/2009 | Sosabowski et al. |
| 2010/0061568 A1 | 3/2010 | Rasmussen |

OTHER PUBLICATIONS

International Search Report, dated Jul. 14, 2014, Application No. PCT/US2013/065448, pp. 1-2.
Written Opinion of International Searching Authority, dated Jul. 14, 2014, Application No. PCT/US2013/065448; pp. 1-6.

* cited by examiner

NOISE DETECTION, DIAGNOSTICS, AND CONTROL OF MODELOCKED LASERS

CROSS-REFERENCE TO RELATED APPLICATIONS

This application is a by-pass continuation of international application No. PCT/US2013/065448, filed Oct. 17, 2013, which claims priority to U.S. Provisional Application No. 61/716,148, filed Oct. 19, 2012. The contents of the prior applications are incorporated herein by reference in their entirety.

FIELD OF THE INVENTION

This invention relates generally to noise detection, diagnostics, and control of pulsed laser systems, and more particularly systems in which mode-locked lasers are utilized.

BACKGROUND

Pulsed laser systems comprising an oscillator and high power fiber amplifier(s) are well known in the art. See, for example, U.S. Pat. Nos. 6,208,458; 6,181,463; and 5,696,782. Conventional systems typically operate at a fixed pulse width and repetition rate. However, systems with variable pulse widths and repetition rates have also been developed. For example, see U.S. Pat. Nos. 6,347,007; 6,335,941; and 6,433,306 to Grubb et al. For certain applications, it is desired that the output pulse energy of these types of systems be maintained at a constant value as the pulse width and repetition rate of the pulse source is varied. This problem is addressed in U.S. Pat. No. 7,505,196 which discloses methods and systems for controlling and protecting pulsed high power fiber amplifier systems.

The gain of the amplifier system depends on the rate at which energy is stored into, and depleted from, the doped fiber. Therefore, output pulse energy varies as a function of the rate of energy storage into the amplifier and the repetition rate of the seed, which extracts energy from the amplifier. A known method includes adjusting the gain of the amplifier by adjusting the power of the amplifier pump diode by changing its drive current as a function of the seed source pulse energy and repetition rate. A further alternative, which is suitable under some conditions, includes changing the pulse energy of the seed source by modulating the source directly or attenuating its input to the power amplifier.

Methods for controlling and protecting amplifiers from undesirable operation modes of modelocked lasers are described in U.S. Pat. No. 7,505,196, entitled: "Method and apparatus for controlling and protecting pulsed high power fiber amplifier systems", assigned to the assignee of the present invention, and hereby incorporated by reference in its entirety.

U.S. Pat. No. 6,839,363, entitled "Digital control of actively mode-locked lasers" discloses a processor that digitally extracts noise information from multiple monitor signals generated from the laser output. Control functions are achieved with one or more bandpass filters covering various portions of the frequency range of the laser output. In U.S. Pat. No. 6,839,363, a microprocessor digitally diagnoses the operating condition of the laser based on the noise information. Mode locking may be maintained by reducing the noise. An array of A/D and D/A converters allow for digital control of the active mode-locked laser.

Takara et al, in "Stabilisation of a modelocked Er-doped fibre laser by suppressing the relaxation oscillation frequency component", *Electronic Letters*, 16 Feb. 1995, Vol. 31 No. 4, 292-293, disclosed a stabilizing method based on the observation that the relaxation oscillation RF power of the detected output pulses is a good measure of instability. Stable bit-error-free operation at 6.3 GHz for long periods was reported. The bandwidth of the optical receiver was set in the range from 10 Hz to 200 kHz. The RF power ratio between the 6.3 GHz mode-locking frequency and background noise exceeded 70 dB.

Mode-locked laser systems are also widely used in frequency metrology, where the mode-locked laser acts as a frequency comb that can be used for precision measurements. Generally, such frequency combs are susceptible to noise. Low noise operation of the mode-locked laser can further improve precision. For example, high sensitivity detection and elimination of rapid multiple (double) pulsing while providing low latency for high speed execution of control functions is desirable.

A need exists for high sensitivity diagnostic tools for use with mode-locked lasers, particularly for application to frequency comb metrology. It is desirable to distinguish noisy and quiet operation of mode-locked lasers, and to rapidly detect pulse instabilities such as double pulses, period doubling, Q-switch mode-locking and other phenomena which degrade the quality of mode-locked signals, and which may occur over a wide frequency range.

SUMMARY

An object of the invention is to monitor noise of a mode-locked laser source over a wide frequency bandwidth and wide dynamic range, and to control operation of a laser based system in which the mode-locked laser is utilized.

An object of the invention is to protect a high power amplifier from damage caused by gain buildup in excess of the damage threshold of the amplifier.

An object of the invention is to monitor noise of a mode-locked oscillator and to provide operation of the mode-locked oscillator as a stable frequency comb laser for precision frequency metrology.

One aspect of the present invention features a laser based system configured with a noise detection unit. The system includes a mode-locked oscillator generating optical pulses at a repetition frequency, $f_{rep}$. A noise detection unit includes at least one optical detector that monitors optical pulses generated by the mode-locked oscillator and produces an electrical signal in response to the optical pulses. The noise detection unit includes a first filter to transmit signal power over a signal bandwidth which includes repetition frequency, frep. The noise detection unit optionally includes one or more filters to transmit power over a noise bandwidth that substantially excludes repetition frequency, frep. Non-linear signal processing equipment is utilized to generate one or more signals representative of the power in the signal bandwidth relative to the power in the noise bandwidth. The system includes a controller which estimates the relative power in the signal bandwidth and in the noise bandwidth, and is operable to generate a signal for controlling the laser based system based on the relative power.

The first filter may include a bandpass filter centered about frep or a bandpass filter centered at any harmonic of frep.

One or more optional filters may include a low pass filter with a frequency cutoff less than frep.

A low pass filter may have a cutoff as low as about $f_{rep}/2$.

Optical pulses may be monitored by extracting a portion of the optical pulses with an optical tap which is coupled to the detector.

Non-linear signal processing equipment may provide an available dynamic range of at least about 60 dB via signal compression, and may include a logarithmic converter.

The available dynamic range may be in the range from greater than 80 dB to about 100 dB.

The controller may include digital signal acquisition and processing equipment, for example high resolution A-D converter(s), to provide for an estimate of the relative power.

The system may include at least one optical amplifier downstream from the mode-locked oscillator, and the controller may generate a signal to decrease the energy of a pump diode utilized to pump the mode-locked laser and/or the downstream optical amplifier.

The controller may generate a signal for control of the temperature, pressure, and/or position of an intra-cavity element of the mode-locked oscillator.

The controller may comprise high-speed digital circuitry to provide one or more signals representative of at least the relative power in a signal bandwidth and a noise bandwidth. The controller is capable of generating said signals with a low-latency in the range from about several hundred ps to 20 ns.

The system may include a frequency comb source for optical metrology.

The system may be configured as a portion of a micromachining system or laser surgery system.

In at least one embodiment a noise detection unit and controller are provided to monitor the noise of injected pulses into the amplifier system, and to compare the noise to a predetermined maximum noise level, and if higher than this maximum noise level, to disable or reduce the current to the amplifier pump diode to prevent it from being damaged.

In at least one embodiment the noise of injected oscillator pulses, an external signal, or both is monitored. If the noise exceeds a certain threshold the diode pump current is reduced or shut off.

In at least one embodiment a noise detection unit and controller includes a means for comparing the amplitude of a pulse being injected into a fiber amplifier with a predetermined minimum amplitude value, and a means to disable or reduce the current to the amplifier pump diode to prevent it from being damaged whenever the amplitude is lower than this predetermined minimum.

A device in accordance with an embodiment of the invention also provides a means of selecting and attenuating the seed pulses such that the amplified output pulses are of uniform energy.

BRIEF DESCRIPTION OF THE DRAWINGS

Objects and features of the present invention will become more readily apparent from the following detailed description of the preferred embodiments taken in conjunction with the accompanying drawings:

FIG. 2A illustrates an optical spectrum of a frequency comb laser.

FIG. 2B is a plot showing a portion of the RF spectrum of a mode locked laser, which includes the repetition frequency, $f_{rep}$, and the second harmonic, $2f_{rep}$.

FIG. 2C is a plot illustrating bandpass and low-pass filtering of the RF spectrum in accordance with an embodiment.

FIGS. 4A-1-4D-2 are examples comparing exemplary temporal shapes and spectra of mode-locked lasers under (a) low noise conditions and (b) in the presence of noise generated by multiple pulses, unwanted q-switching, and/or random signal fluctuations.

DETAILED DESCRIPTION

Figure 1:
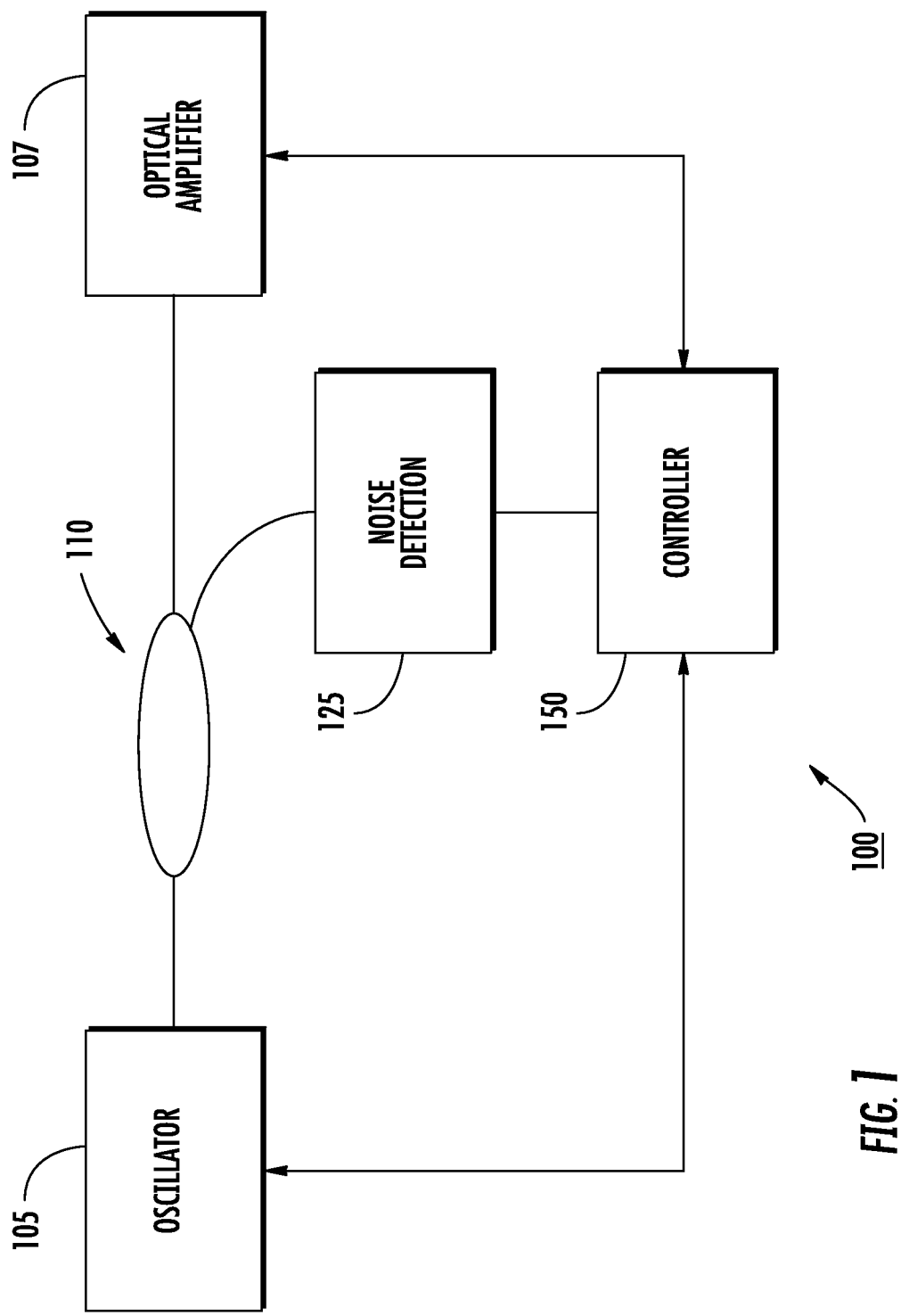
FIG. 1 schematically illustrates an arrangement utilizing a laser source and noise detection arrangement according to an embodiment of the present invention.

A block diagram of a system of the present invention is shown in FIG. 1. This example includes a mode-locked oscillator 105, an optical amplifier 107, a noise detection system 125, and a controller 150. In this arrangement the controller 150 is configured to control and monitor various parameters of both the oscillator 105 and amplifier 107. Exemplary mode-locked oscillators, amplifiers or frequency combs were for example described in U.S. Pat. No. 8,031,396 ('396) entitled "Modular, high energy, widely-tunable ultrafast fiber source": U.S. Pat. No. 7,649,915 (915), entitled "Pulsed laser sources": U.S. Pat. No. 7,809,222 ('222), entitled "Laser-based frequency standards and their applications"; and U.S. patent application Ser. No. 12/955,759 ('759), entitled "Frequency comb system with large comb spacing". The '396, '915, '222 patents, and the '759 application, are hereby incorporated by reference in their entirety.

In certain embodiments the oscillator output is directed to an amplifier. Preferably, fiber oscillators and amplifiers are used, but solid-state laser oscillators and amplifiers or hybrid systems comprising fiber and solid-state components can also be used. In some embodiments an amplifier 107 may not be required if the pulse energy produced by the oscillator is sufficiently high.

Oscillator noise may be monitored by directing a fraction of the oscillator output to a noise detection system. A fiber tap, beam splitter, or other suitable beam sampling element 110 may be utilized. One or more outputs of the noise detection system 125 are further processed by a controller 150 which may provide signals for control of the pump laser(s) for the oscillator or amplifier. For example, the controller 150 can turn the amplifier 107 off for protection if elevated noise is detected and/or the pump to the oscillator 105 can be modified in order to return the oscillator into a low noise operational state. The controller 150 may provide signals to modify the cavity length, adjust temperature of intra-cavity optical elements, or other control functions to achieve a desired condition of operation as discussed in the '915 and '222 patents cited above.

Figure 2A:
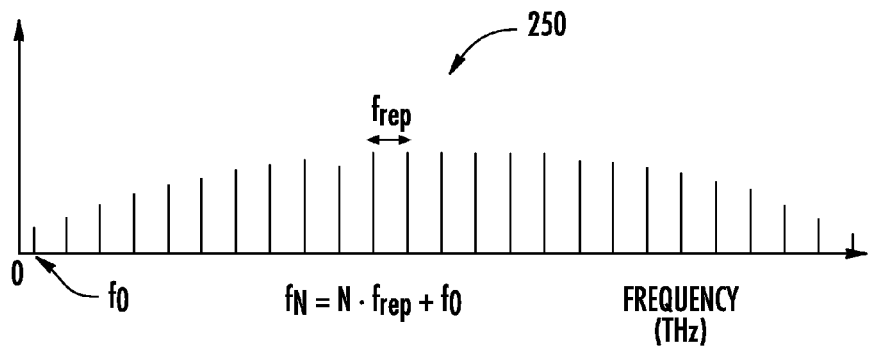
FIGS. 2A-2C are plots illustrating an optical frequency comb and RF spectra of mode-locked lasers.

As is well known in the state of the art, the RF spectrum associated with a mode-locked laser comprises a comb of individual RF frequencies separated by the repetition frequency $f_{rep}$ of the oscillator, as indicated. FIG. 2a illustrates an optical frequency spectrum 250 of a conventional frequency comb laser. To first order the frequency spectrum is determined by $f_{rep}$ and $f_0$. The frequency comb is derived from a mode-locked laser and $f_{rep}$ corresponds to the repetition rate of the pulses generated with the mode-locked laser, whereas $f_0$ corresponds to the carrier envelope offset frequency. In frequency comb systems a high speed photo detector may be used to measure $f_{rep}$, whereas $f_o$ may be determined, for example, using an f-2f interferometer, as well known in the state of the art. Because noise sources associated with the mode-locked laser can limit the performance of frequency comb based optical metrology systems it is desirable to maximize the signal to noise ratio in the RF regime.

Figure 2B:
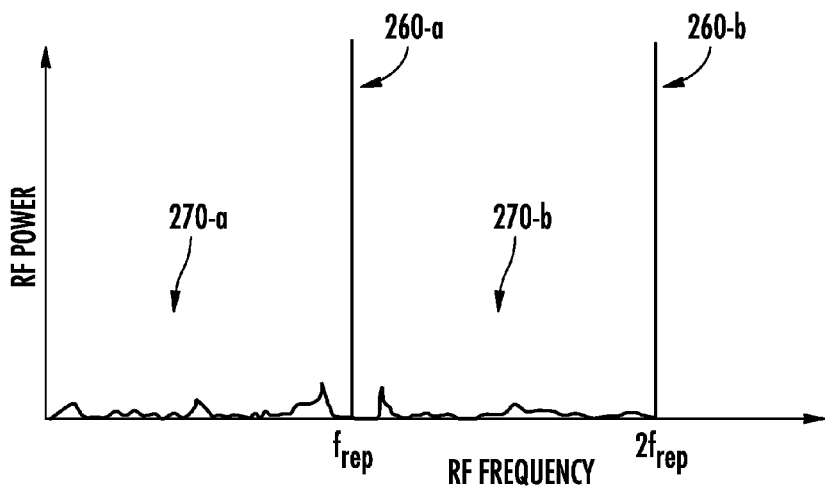
Figure 2C:
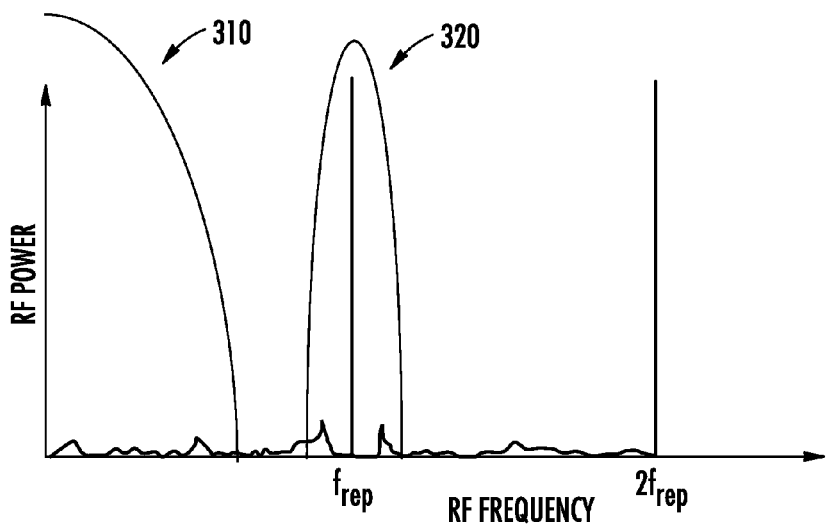

FIG. 2b illustrates the two first mode-locked frequencies $f_{rep}$ (260-a) and $2f_{rep}$ (260-b) in the RF domain. The RF spectrum may also contain a low amplitude noise continuum 270-a, 270-b broadly spread across the RF spectrum arising from laser amplitude and phase noise. Noise contributions may arise from laser shot noise, diode laser noise, persistent relaxation oscillations, amplitude and/or phase instabilities, unwanted q-switching, double (multiple) pulsing or period doubling etc. Generally, the noise spectrum may be characterized as having noise components which are largely frequency independent, and other frequency dependent components, including narrowband noise components.

An operational state of a mode-locked laser is desired in which the RF noise in the RF spectrum is minimized. Once a mode-locked laser is operating properly, the energy ratio between the energy contained in the RF comb lines and the noise continuum is effectively maximized. In various embodiments proper mode-locked operation of the laser can be verified by measuring the RF power contained in the RF combs and comparing the measured power with that of the noise continuum.

Figure 3:
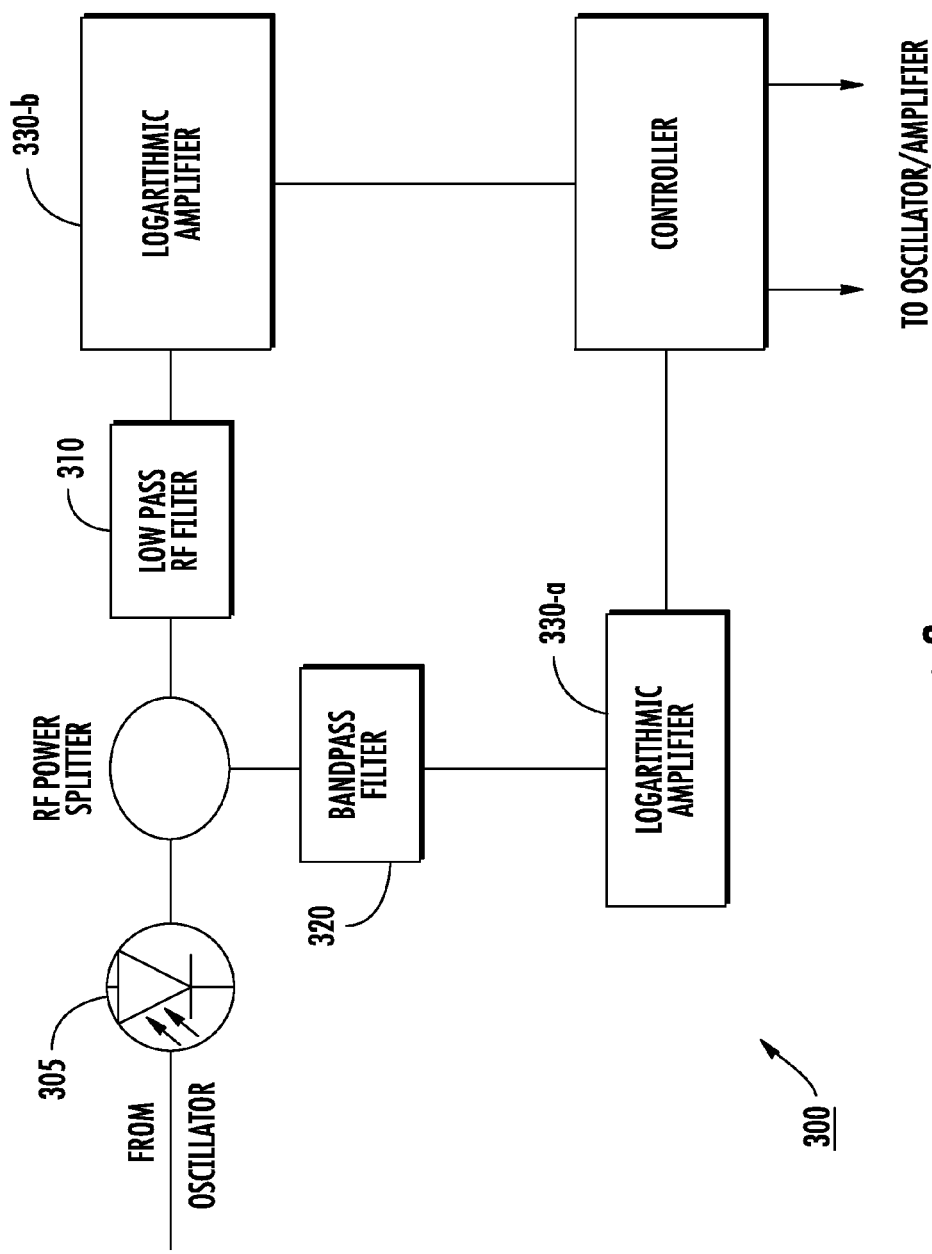
FIG. 3 schematically illustrates a noise detection system in accordance with an embodiment.

A noise detection system is further illustrated in FIG. 3. An extracted portion of the oscillator output is detected with an optical detector 305. The detector arrangement may include an RF amplifier stage (not shown) or other suitable amplifier to convert detector current to an input voltage. In some embodiments additional detectors/amplifiers arrangements may be utilized to generate voltage and/or current signals for downstream processing and analysis. For example, extraction of the detector DC photocurrent may be used for additional calibration or control functions. The DC photocurrent can be extracted by a bias-T and then detected as a voltage drop over a sense-resistor (not shown), as is well known in the art. Moreover, the detection system may include additional components for analog and/or digital processing and signal conditioning.

The RF signal generated by converting the optical signal from the oscillator 105 to an electrical signal in the detector 305 is split into multiple parts by an RF power splitter or an RF directional coupler. The splitting ratio does not need to be equal. The RF signal in the first arm is then filtered with low pass filter 310 in order to detect the noise continuum power. Preferably, the low pass filter has a cut-off frequency $f_{cut-off} < f_{rep}$ with $f_{cut-off} < f_{rep}/2$ being found as suitable. However, one could just as well detect the noise continuum between $f_{rep}$ and $2f_{rep}$, or a suitable fraction of the range.

The RF signal in the second arm is then filtered by an RF bandpass filter 320 centered about $f_{rep}$, and/or $2f_{rep}$ or $3f_{rep}$ etc.

Those skilled in the art will recognize that the filter characteristics of exemplary low pass filter 310 and bandpass filter 320 may be tailored in various ways for flatness, falloff characteristics, spectral width and the like. In some embodiments a high pass filter may be sufficient provided that noise is negligible relative to power at frep and the harmonics. In some embodiments the upper portion of the spectrum may be filtered or attenuated.

It is desirable to extend both the measurement speed and sensitivity of noise detection for high repetition rate mode-locked lasers and frequency comb systems. In various embodiments non-linear signal processing equipment is incorporated to provide wide dynamic range operation. Referring to the example of FIG. 3, filtered outputs are received by a pair of logarithmic amplifiers 330-a, 330-b (e.g.: log converters). In certain preferred embodiments noise detection and subsequent control operations can be performed at high speed and low latency using wideband, wide dynamic range log converters. The logarithmic RF converters are designed to produce a voltage output proportional to the log of the RF power, enabling RF power detection over a wide dynamic range, for example, over about 5-10 decades (orders of magnitude).

In another embodiment part of the filtered signal after the second arm can be used to detect the repetition frequency or any of its harmonics for frep monitoring and/or feedback control.

By way of example, one such log converter is Analog Devices' AD8310 demodulating logarithm amplifier capable of maintaining good logarithmic conformance over an input dynamic range exceeding about nine decades, and a gain-bandwidth product of about $10^4$ GHz. DC-440 MHz operation is specified, with some decrease in logarithmic conformance above about 100 MHz. One application of such amplifiers is the detection of short bursts of RF energy as short as tens of ns in duration. When used for high-speed control of the mode locked lasers, the combination of wide dynamic range and low latency can improve performance relative to control systems based on linear amplifiers and A/D and D/A conversion.

The RF power detected by the RF power meters is converted to a suitable voltage output which is further directed to the controller. The controller is configured to control the oscillator or amplifier pump laser. The controller can turn the amplifier off in case undesirable oscillator operation is detected, in order to prevent damage to any optical components in the system, and/or otherwise control the oscillator and/or amplifier. As another example, the oscillator pump current can be reduced is such a case.

The following examples are instructive for comparing low noise mode locked signals, for example, with $f_{rep}$ near 100 MHz, with mode-locked signals degraded by double pulsing, q-switching, a random noise over a broadband frequency spectrum, or the like. The illustrated waveforms and spectra shown in FIGS. 4a-1-4d-2 are similar to observations made with a digital oscilloscope and RF spectrum analyzer in a test arrangement corresponding to FIG. 3. The schematic illustrations are representative of the time domain and frequency information received.

Figures 2, 4A:
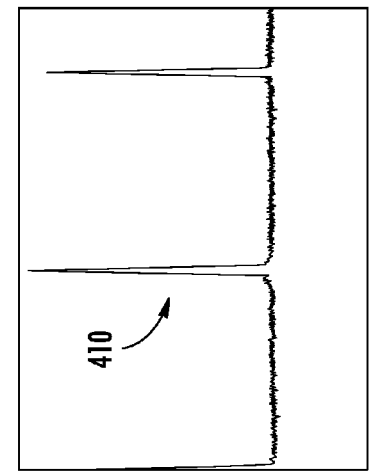

Low Noise Mode-Locked Operation:

FIGS. 4a-1 illustrates relatively low noise mode-locked operation as exemplified by the inverted oscilloscope traces. FIG. 4a-2 shows the corresponding RF spectrum which includes $f_{rep}$ 410 and 2frep.

Figures 2, 4B:
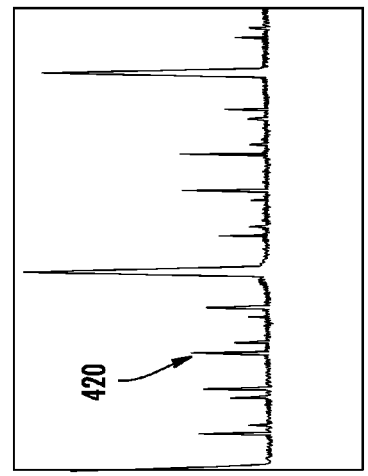
Figures 1, 4A:
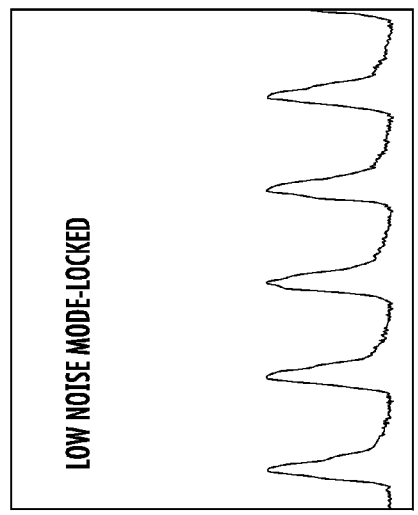
Figures 1, 4B:
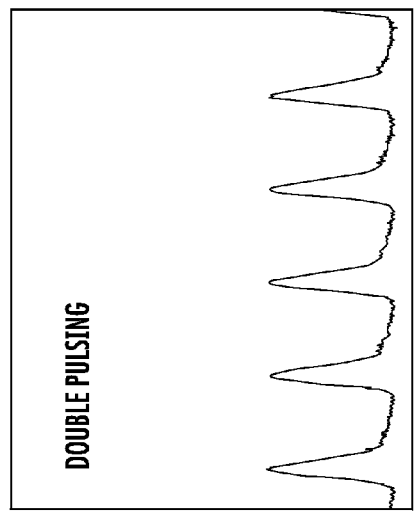

Double Pulsing:

FIGS. 4b-1 illustrates double pulsing. The effect is difficult to detect from the time domain traces, but is apparent from the spiky frequency content 420 in FIG. 4b-2. Notably, in the time domain the spacing between the multiple pulses is very small and difficult to discern.

Figures 2, 4C:
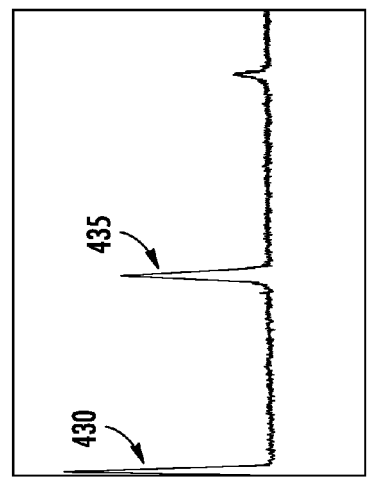

Q-Switching:

FIGS. 4c-1 illustrates the presence of Q-switching in the time domain. It can be seen that the waveform is severely degraded and distorted relative to that of FIG. 4a-1. The waveform is representative of a sequence of mode-locked pulses contained in a more slowly varying Q-switched envelope generated at KHz frequencies (represented by the wide time separation in the plot). The effect is noticeable in FIG. 4c-2 as having strong low frequency components 430 together with reduced power at frep 435 and in the second harmonic.

Figures 2, 4D:
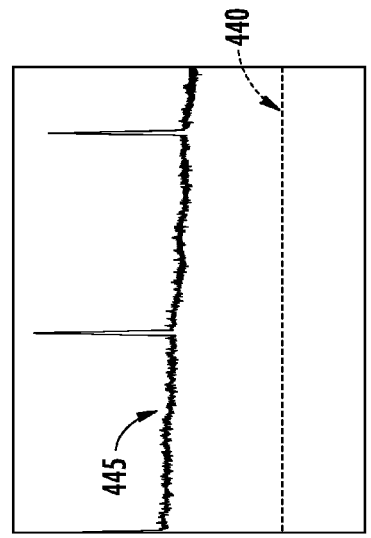
Figures 1, 4C:
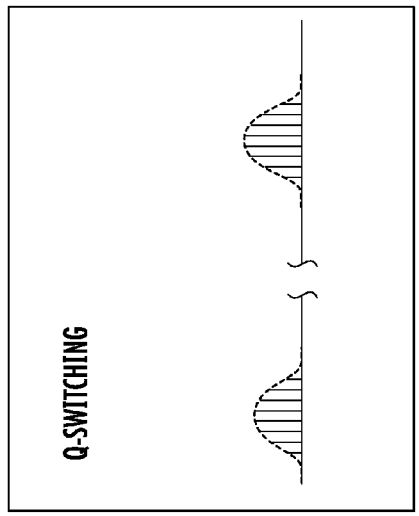
Figures 1, 4D:
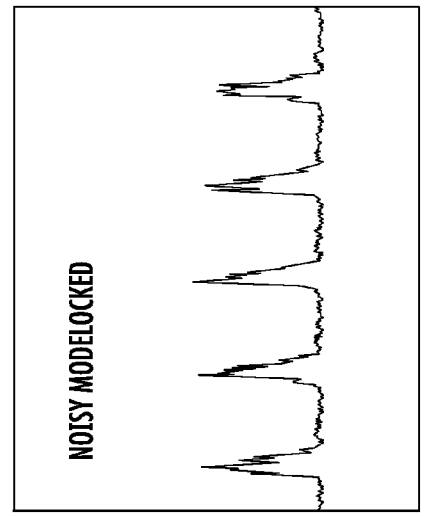

Noisy Mode-Locked:

FIG. 4d-1 illustrates erroneous pulse temporal shapes characterizable by high frequency spikes, in contrast to a smooth Gaussian like temporal profile shown in FIGS. 4a-1 and 4b-1. The frequency domain data of FIG. 4d-2 shows the mode-locked signals and a nearly uniform noise (e.g.: white) noise spectrum 445 indicative of large and random fluctuations. The noise is well above zero power (horizontal axis) 440.

In an experiment using the high sensitivity arrangement described above, the background noise power caused by double pulsing was discriminated from the low noise mode-locked state. The dB difference was significantly above the specification for the log amplifier dB error allowing for such detection. Notably, the "double pulse" data was manifested by a narrow series of spectral spikes of relatively low amplitude and effectively undetectable with conventional domain observations. However, the relative increase in integrated noise power was detectable with the high-sensitivity, non-linear signal processing equipment. For example, an increase of at least about 2 dB was sufficient to identify a double pulse noise contribution characterized by having spectra similar to that in FIG. 4b-2. The q-switching and noisy modes locked were easily detected with the high sensitivity arrangement.

The two logarithmic power meters in the example of FIG. 2 can essentially detect four states of laser operation. For the purpose of discussion we refer to the bandpass filtered RF power as $RF_{ml}$, and the low pass filtered RF power as $RF_{noise}$. The following states of operation may be identified from the respective signals:

If $RF_{ml}$ is high and $RF_{noise}$ is low or the ratio $RF_{ml}/RF_{noise}$ is maximized the laser is properly modelocked.

If $RF_{ml}$ is high and $RF_{noise}$ is high, the laser operates in a Q-switched mode-locked operation regime or is subject to persistent relaxation oscillations.

If $RF_{ml}$ is low and $RF_{noise}$ is high, the laser is Q-switching.

If $RF_{ml}$ is low and $RF_{noise}$ is low, the laser is oscillating in continuous wave mode or is essentially off. Those two modes of operation can be distinguished by monitoring the DC photocurrent of the detector as discussed above.

Moreover, a transition from single pulse to two pulse operation generally also affects the ratio $RF_{ml}/RF_{noise}$. Thus the arrangement of FIG. 2, with the increased sensitivity and bandwidth, improves detectability of a multiple pulse condition in which the mode-locked laser operates with two pulses per round-trip.

The determination of the state of the mode-locked laser can thus be reliably determined. By way of example, this can be done with a microcontroller which determines $RF_{ml}/RF_{noise}$. High speed, low latency control can be achieved because for the determination of the state of the mode-locked laser it is not necessary to use A-D converter(s) which may introduce considerable latency that limits high speed control. It is to be understood, however, that in certain implementations high resolution A/D and/or D/A converters may be utilized with a suitable compromise in the control bandwidth, or for other auxiliary operations. In various preferred embodiments all-logic processing may be implemented with high speed comparators, DSPs, or FPGAs. The controller is capable of providing low latency signals representative of at least the relative power in the signal bandwidth and noise bandwidth. By way of example, a latency representing a response to an output of the noise detection unit may be in the range from about several hundred picoseconds to about 20 ns for certain high speed operations using present commercially available technology, and further reduced via custom logic design and optimization. One application of such high speed control is to enable rapid shutdown of the oscillator/amplifier if the noise and/or laser power exceeds a certain threshold. For example, the system may be configured to rapidly shutdown one or more pump diodes that pump the oscillator or amplifier. In some embodiments the system may also include a low delay modulator operatively coupled to the controller and mode-locked laser to attenuate laser power. In some embodiments the controller may be arranged to count or average a series of consecutive pulses prior to shutting down the pump so to improve noise immunity.

In various implementations, prior to interruption of mode-locked operation of a mode-locked oscillator, an increase in RF noise can be detected. The noise detection system illustrated above can protect optical components by turning the amplifier pump laser off before mode-locked operation is lost. This provides a very sensitive high speed and low latency method to protect high power laser systems from any possible damage, as amplifiers can be turned off to avoid damage. Such operation is beneficial for sensitive machining applications, for example in medical or micromachining applications for precise control of the fluence at a target material location.

Embodiments of the present invention are applicable to many types of mode-locked arrangements. The amplifier can be turned off and the micro-controller can be used to search for a stable operation of the mode-locked oscillator by changing the oscillator pump current or any other oscillator operating condition such as oscillator temperature polarization control etc. Once stable oscillator operation is ensured, the amplifier can be turned on again. U.S. Pat. No. 6,839,363 (Lin), U.S. Pat. No. 6,693,927 (Horvath), and U.S. Pat. No. 7,668,213 (Hoffman) discuss various techniques to establish and maintain mode-locking in actively or passively mode locked fiber lasers, and in various mode-locked solid state arrangements. A noise detection system of the present invention may be utilized to enhance the sensitivity of such systems.

Figure 5A:
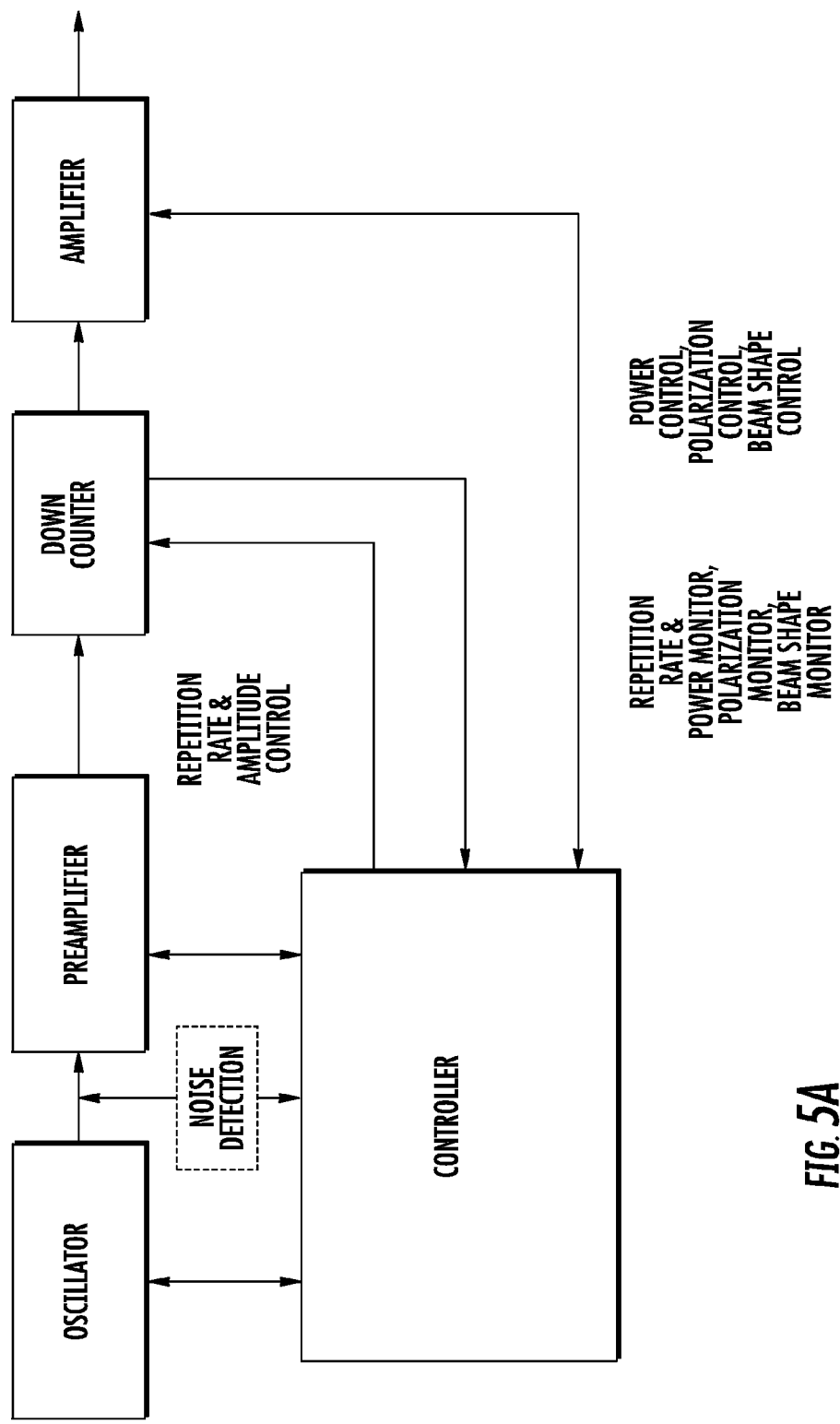
FIGS. 5A and 5B schematically illustrate an exemplary fiber-based laser system adapted with a noise detection unit according to an embodiment of the present invention.
Figure 5B:
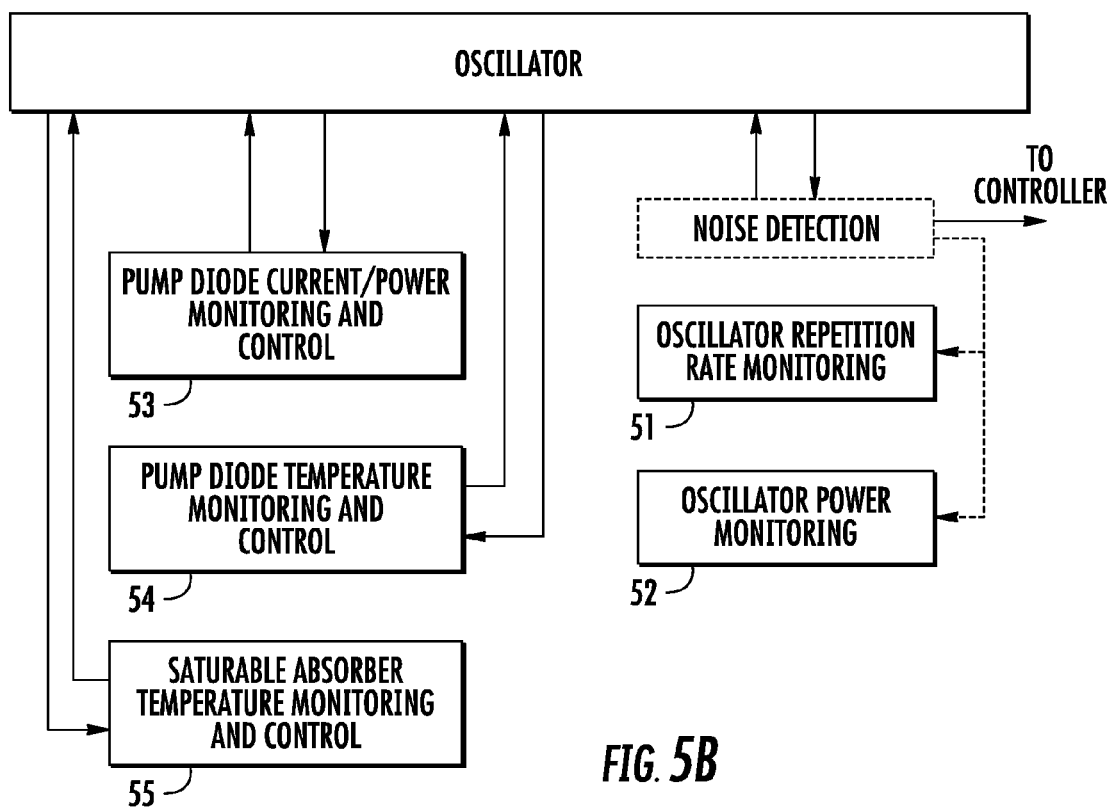

For example, as illustrated in FIG. 5a, a noise detection system can be included into the arrangement disclosed in U.S. Pat. No. 7,668,213 referenced above, which is hereby incorporated by reference in its entirety. In the example of FIG. 5a, the oscillator noise detection unit provides auxiliary outputs utilized by oscillator repetition rate monitoring device 51, and oscillator power monitor 52. Moreover, referring back to FIG. 1 of the present application, the controller of system 100 may be operatively connected to any or all of the monitoring/control elements for the pump current 53, diode temperature 54, or saturable absorber shown in FIG. 5b for use in a highly integrated arrangement.

Figure 6:
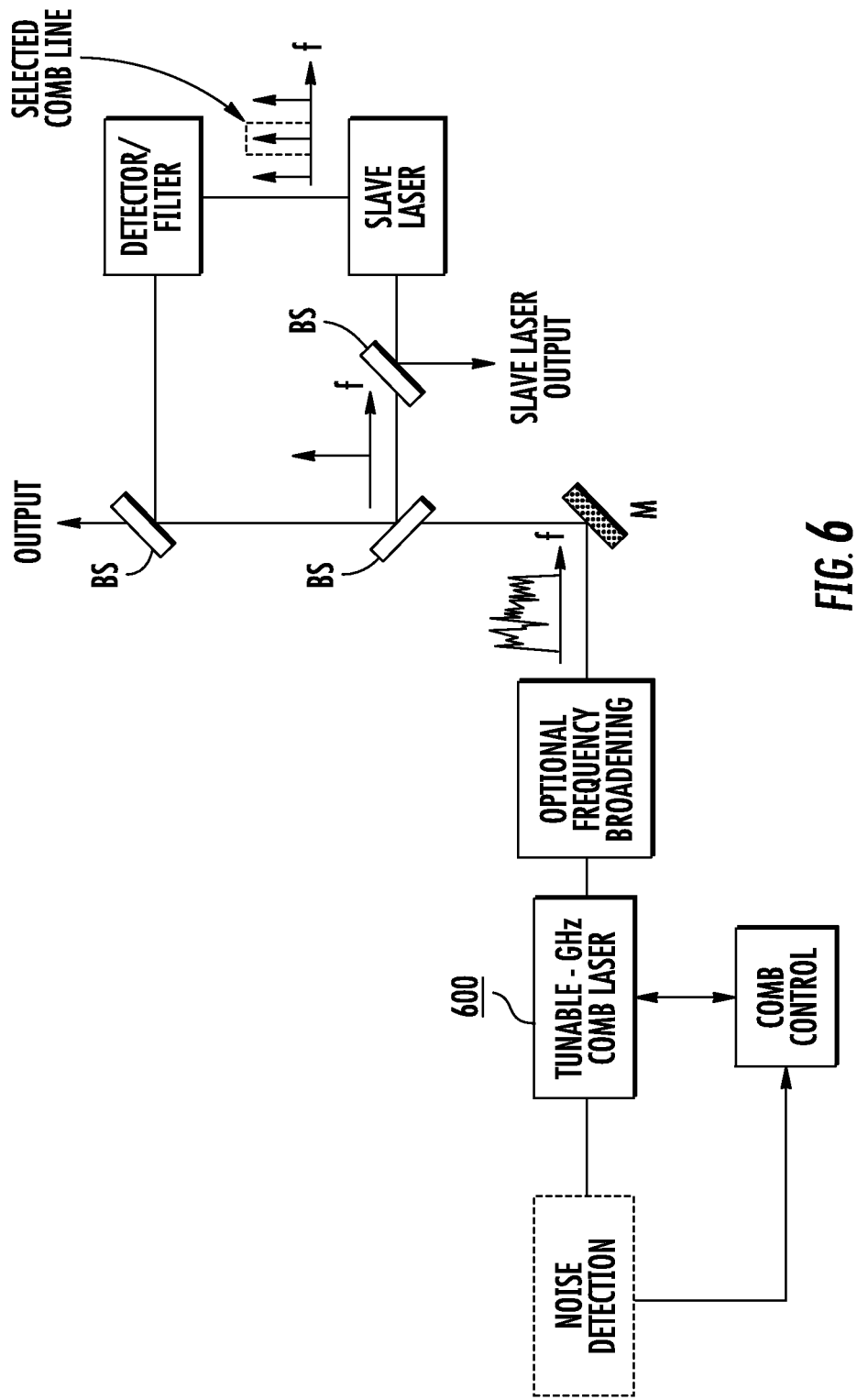
FIG. 6 schematically illustrates an exemplary frequency comb source adapted with a noise detection unit according to an embodiment of the present invention.

Similarly, as illustrated in FIG. 5a, a noise detection system may readily be adapted for use with various arrangements disclosed in U.S. Pat. No. 7,505,196 referenced above (incorporated by reference herein). As shown in FIG. 7 of the '196 patent, various optical and electrical parameters can be monitored and controlled. Control of these parameters can be incorporated into the laser controller or into a system controller that is external to the laser controller and specific to the particular application. The laser controller has the ability to communicate with an external system controller over a communications link using communication interfaces common to computer communication, such as RS-232, IE-488, TCP/IP or CAN bus The present detection system is particularly useful for determining the proper low noise operation of mode-locked comb systems, as excessive laser noise will affect the accuracy of any subsequent metrology applications. When excess laser noise is detected, the oscillator parameters can thus be re-optimized using the micro-controller for a service request. For example, U.S. patent application Ser. No. 12/955,759, ('759), entitled "Frequency comb system with large comb spacing", discloses a frequency comb system having a tunable GHz comb laser. FIG. 6 of the present application schematically illustrates a noise detection arrangement according to an embodiment of the present invention integrated in a system of the '759 application to monitor the tunable GHz laser 600. In this embodiment a slave laser, for example a quantum cascade laser is feedback stabilized to a selected comb line of the tunable GHz laser 600. The noise detection system together with the comb control system ensures that the tunable GHz laser 600 operates in a low-noise mode-locked state. By way of the slave laser control, any noise of the tunable GHz laser 600 can be transferred to the slave laser. A noise detection arrangement as described herein ensures that little or no excess noise of the tunable GHz laser 600 will affect the slave laser. The system may be easily interfaced to a communication network for remote diagnostics and adjustments.

For purposes of summarizing the present invention, certain aspects, advantages and novel features of the present invention are described herein. It is to be understood, however, that not necessarily all such advantages may be achieved in accordance with any particular embodiment Thus, the present invention may be embodied or carried out in a manner that achieves one or more advantages without necessarily achieving other advantages as may be taught or suggested herein.

The invention has been described in several embodiments. It is to be understood that the embodiments are not mutually exclusive, and elements described in connection with one embodiment may be combined with, or eliminated from, other embodiments in suitable ways to accomplish desired design objectives.

Thus, while only certain embodiments have been specifically described herein, it will be apparent that numerous modifications may be made thereto without departing from the spirit and scope of the invention. Further, acronyms are used merely to enhance the readability of the specification and claims. It should be noted that these acronyms are not intended to lessen the generality of the terms used and they should not be construed to restrict the scope of the claims to the embodiments described therein.

The invention claimed is:

1. A laser based system, comprising:
    a mode-locked oscillator generating optical pulses at a repetition frequency, $f_{rep}$;
    a noise detection unit comprising:
        at least one optical detector that monitors optical pulses generated by the mode-locked oscillator and produces electrical signals in response to the optical pulses, said noise detection unit comprising a first filter to transmit signal power over a signal bandwidth which includes said repetition frequency, $f_{rep}$, and further comprising one or more additional filters to transmit power over a noise bandwidth that substantially excludes the repetition frequency, $f_{rep}$;
        non-linear signal processing equipment to generate one or more signals representative of power in the signal bandwidth relative to power in the noise bandwidth; and
    a controller which estimates the relative power in the signal bandwidth and in the noise bandwidth, and is configured to generate a signal for controlling at least an element of the laser based system based on the relative power.

2. The system of claim 1, wherein said first filter comprises a bandpass filter centered about frep.

3. The system of claim 1, wherein said one or more additional filters comprises a low pass filter with a frequency cutoff less than $f_{rep}$.

4. The system of claim 3, wherein said frequency cutoff of said low pass filter is as low as about $f_{rep}/2$.

5. The system of claim 1, wherein said noise detection unit comprises an optical tap coupled to said optical detector and configured to extract a portion of the optical pulses.

6. The system of claim 1, wherein said non-linear signal processing equipment provides an available dynamic range of at least about 60 dB via signal compression.

7. The system of claim 6, wherein said non-linear signal processing equipment comprises a logarithmic converter.

8. The system of claim 6, wherein said dynamic range may be in the range from greater than 80 dB to about 100 dB.

9. The system of claim 1, wherein said controller comprises digital signal acquisition and signal processing equipment to provide for an estimate the relative power.

10. The system of claim 1, further comprising at least one optical amplifier downstream from the mode-locked oscillator, and wherein said controller generates a signal to control the energy of a pump diode utilized to pump the mode-locked oscillator and/or the downstream optical amplifier.

11. The system of claim 1, wherein the controller is configured to generate a signal for control of the pump diode current, temperature, pressure, and/or position of an intracavity element of the mode-locked oscillator.

12. The system of claim 1, wherein said controller comprises high-speed digital circuitry to provide one or more signals representative of at least the relative power in the signal bandwidth and noise bandwidth, said controller generating said signals with a low-latency in the range from about several hundred ps to 20 ns.

13. The system of claim 1, wherein said system comprises an optical frequency comb generator, at least a portion of which comprises said mode-locked oscillator.

14. The system of claim 1, wherein said laser-based system is configured as a portion of a frequency comb source for optical metrology.

15. The system of claim 1, wherein said laser-based system is configured as a portion of a laser-based micromachining system or laser surgery system.

* * * * *